(12) United States Patent
Ham

(10) Patent No.: US 9,130,545 B2
(45) Date of Patent: Sep. 8, 2015

(54) PERIOD SIGNAL GENERATION CIRCUITS

(71) Applicant: SK hynix Inc., Icheon-si Gyeonggi-do (KR)

(72) Inventor: Hyun Ju Ham, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/627,016

(22) Filed: Feb. 20, 2015

(65) Prior Publication Data

US 2015/0171831 A1 Jun. 18, 2015

Related U.S. Application Data

(62) Division of application No. 13/965,793, filed on Aug. 13, 2013, now Pat. No. 8,994,428.

(30) Foreign Application Priority Data

Feb. 7, 2013 (KR) .................. 10-2013-0014156

(51) Int. Cl.
- *H03K 5/05* (2006.01)
- *H03K 3/011* (2006.01)
- *G05F 1/46* (2006.01)
- *H03K 3/037* (2006.01)

(52) U.S. Cl.
CPC ............... *H03K 3/011* (2013.01); *G05F 1/463* (2013.01); *H03K 3/037* (2013.01); *H03K 5/05* (2013.01)

(58) Field of Classification Search
CPC ........................................... H03K 3/011
See application file for complete search history.

(56) References Cited

U.S. PATENT DOCUMENTS

| | | | | |
|---|---|---|---|---|
| 5,859,571 A * | 1/1999 | Lee et al. | .......... | 331/53 |
| 6,300,843 B1 * | 10/2001 | Kodama | .......... | 331/111 |
| 6,825,735 B2 * | 11/2004 | Chung | .......... | 331/135 |
| 7,385,453 B2 * | 6/2008 | Nervegna | .......... | 331/176 |
| 7,969,253 B2 * | 6/2011 | Shiah et al. | .......... | 331/185 |
| 8,373,502 B1 * | 2/2013 | Chen et al. | .......... | 327/551 |

* cited by examiner

*Primary Examiner* — Thomas J Hiltunen
(74) *Attorney, Agent, or Firm* — William Park & Associates Ltd.

(57) ABSTRACT

A period signal generation circuit including a control voltage generator and a period controller. The control voltage generator selecting one of temperature-dependent voltages to output the selected temperature-dependent voltage as a control voltage. The first and second temperature-dependent voltages varying according to a temperature and the third temperature-dependent voltage is constant regardless of variation of the temperature. The period controller configured to determine an amount of a current discharging from an internal node in response to the control voltage and outputs a periodic signal whose cycle time is determined according to a level of an internal signal induced at the internal node.

9 Claims, 8 Drawing Sheets

FIG.4

| Selection Signal | Internal Signal | Temperature Increase Section | Temperature Decrease Section |
|---|---|---|---|
| SEL<1>="H" | V_CNT | Level Up | Level Down |
| | INTS | Increase of Level Down Rate | Decrease of Level Down Rate |
| | OSC | Decrease of Cycle Time | Increase of Cycle Time |
| SEL<2>="H" | V_CNT | Level Down | Level Up |
| | INTS | Decrease of Level Down Rate | Increase of Level Down Rate |
| | OSC | Increase of Cycle Time | Decrease of Cycle Time |
| SEL<3>="H" | V_CNT | Constant Level | Constant Level |
| | INTS | Constant Level Down Rate | Constant Level Down Rate |
| | OSC | Constant Cycle Time | Constant Cycle Time |

FIG.6

| Selection Signal | Internal Signal | Temperature Increase Section | Temperature Decrease Section |
|---|---|---|---|
| SEL<1>="H" | VDRV | Level Up | Level Down |
| | INTS | Level Up | Level Down |
| | OSC | Increase of Cycle Time | Decrease of Cycle Time |
| SEL<2>="H" | VDRV | Level Down | Level Up |
| | INTS | Level Down | Level Up |
| | OSC | Decrease of Cycle Time | Increase of Cycle Time |
| SEL<3>="H" | VDRV | Constant Level | Constant Level |
| | INTS | Constant Level | Constant Level |
| | OSC | Constant Cycle Time | Constant Cycle Time |

FIG.8

| Selection Signal | Internal Signal | Temperature Increase Section | Temperature Decrease Section |
|---|---|---|---|
| SEL<1>="H" | VREF | Level Up | Level Down |
| | OSC | Decrease of Cycle Time | Increase of Cycle Time |
| SEL<2>="H" | VREF | Level Down | Level Up |
| | OSC | Increase of Cycle Time | Decrease of Cycle Time |
| SEL<3>="H" | VREF | Constant Level | Constant Level |
| | OSC | Constant Cycle Time | Constant Cycle Time |

PERIOD SIGNAL GENERATION CIRCUITS

CROSS-REFERENCES TO RELATED APPLICATIONS

The present application claims priority under 35 U.S.C 119(a) to Korean Application No. 10-2013-0014156, filed on Feb. 7, 2013, in the Korean Intellectual Property Office, which is incorporated herein by reference in its entirety as set forth in full.

BACKGROUND

1. Technical Field

Embodiments of the present disclosure generally relate to semiconductor integrated circuits and, more particularly, to period signal generation circuits.

2. Related Art

Integrated circuits (ICs) including semiconductor memory ICs may need periodic signals to control internal operations thereof. That is, the ICs may execute the internal operations in response to the periodic signals which are generated in the ICs or from an external device. The periodic signal may include pulses which are created to have a uniform cycle. Thus, the periodic signal may be used to execute iterative internal operations of the ICs.

Volatile memory devices, for example, dynamic random access memory (DRAM) devices may lose their stored data as the time elapses even though their power supplies are continuously provided. Thus, all the memory cells in the DRAM devices should be refreshed within a data retention time corresponding to a maximum time that the memory cells can retain data. Since the refresh operation is periodically executed, the DRAM devices may need the periodic signals to execute the refresh operation.

Operation speeds of the semiconductor devices may vary according to a temperature. That is, the higher the temperature is, the slower the operation speed of the semiconductor devices is. In contrast, the lower the temperature is, the faster the operation speed of the semiconductor devices is. If the operation speed of the semiconductor devices varies according to the temperature, the reliability of the semiconductor devices may be degraded to cause malfunction.

SUMMARY

Various embodiments are directed to period signal generation circuits.

According to some embodiments, a period signal generation circuit includes a control voltage generator and a period controller. The control voltage generator selects one of first to third temperature-dependent voltages to output the selected temperature-dependent voltage as a control voltage. The first and second temperature-dependent voltages vary according to a temperature and the third temperature-dependent voltage is constant regardless of variation of the temperature. The period controller determines an amount of a current discharging from an internal node in response to the control voltage and outputs a periodic signal whose cycle time is determined according to a level of an internal signal induced at the internal node.

According to further embodiments, a period signal generation circuit includes a drive voltage generator, a discharger, a level detector and a driver. The drive voltage generator selects one of first to third temperature-dependent voltages to output the selected temperature-dependent voltage as a drive voltage. The first and second temperature-dependent voltages vary according to a temperature, and the third temperature-dependent voltage is constant regardless of variation of the temperature. The discharger discharges charges of an internal node. The level detector compares an internal signal induced at the internal node with a reference voltage to determine a logic level of a periodic signal. The driver drives a level of the internal node to the drive voltage in response to the periodic signal.

According to further embodiments, a period signal generation circuit includes a discharger, a reference voltage generator, a level detector and a driver. The discharger discharges charges of an internal node in response to a bias voltage. The reference voltage generator selects one of first to third temperature-dependent voltages to output the selected temperature-dependent voltage as a reference voltage. The first and second temperature-dependent voltages vary according to a temperature, and the third temperature-dependent voltage is constant regardless of variation of the temperature. The level detector compares an internal signal induced at the internal node with the reference voltage to determine a logic level of a periodic signal. The driver drives the internal node in response to the periodic signal.

According to an embodiment, a period signal generation circuit includes a control voltage generator configured to output a temperature dependent voltage as a control voltage; and a period controller configured to receive the control voltage and to output a periodic signal having a cycle time that is determined according to the received control voltage.

According to an embodiment, a period signal generation circuit includes a drive voltage generator configured to output a temperature dependent voltage as a drive voltage; and a period controller configured to receive the drive voltage and to output a periodic signal having a having a cycle time that is determined according to the received drive voltage.

According to an embodiment, a period signal generation circuit includes a discharger configured to discharge charges of an internal node in response to a bias voltage; a reference voltage generator configured to output a temperature dependent voltage as a reference voltage; a level detector configured to compare an internal signal induced at the internal node with the reference voltage to determine a logic level of a periodic signal; and a driver configured to drive the internal node in response to the periodic signal.

BRIEF DESCRIPTION OF THE DRAWINGS

Embodiments of the inventive concept will become more apparent in view of the attached drawings and accompanying detailed description, in which:

FIG. 4 is a table illustrating an operation of the period signal generation circuit shown in FIG. 1;

FIG. 6 is a table illustrating an operation of the period signal generation circuit shown in FIG. 5;

FIG. 8 is a table illustrating an operation of the period signal generation circuit shown in FIG. 7.

DETAILED DESCRIPTION OF THE EMBODIMENTS

Various examples of embodiments of the inventive concept will be described hereinafter with reference to the accompanying drawings. However, the various embodiments described herein are for illustrative purposes only and are not intended to limit the scope of the inventive concept.

Figure 1:
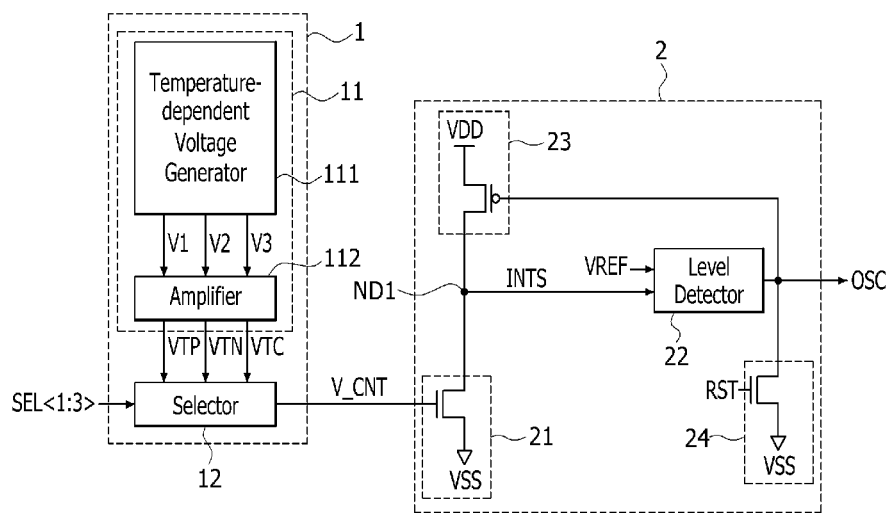
FIG. 1 is a block diagram illustrating a configuration of a period signal generation circuit according to an embodiment.

FIG. 1 is a block diagram illustrating a configuration of a period signal generation circuit according to an embodiment.

As illustrated in FIG. 1, a period signal generation circuit according to the present embodiments may be configured to include a control voltage generator 1 and a period controller 2. The control voltage generator 1 may include a temperature-dependent voltage amplifier 11 and a selector 12. The temperature-dependent voltage amplifier 11 may include a temperature-dependent voltage generator 111 and an amplifier 112. The period controller 2 may include a discharger 21, a level detector 22, a driver 23 and a reset unit 24.

The temperature-dependent voltage generator 111 may generate first and second temperature-dependent voltages V1 and V2 whose levels vary according to a temperature, and a third temperature-dependent voltage V3 whose level has a constant value regardless of a temperature. The first temperature-dependent voltage V1 may linearly increase as the temperature rises and the second temperature-dependent voltage V2 may linearly decrease as the temperature rises. The temperature-dependent voltage generator 111 may be realized using a Widlar circuit or the like which generates a constant voltage level or a variable voltage level according to a temperature.

The amplifier 112 may amplify the first, second and third temperature-dependent voltages V1, V2 and V3 to generate a first amplified voltage VTP, a second amplified voltage VTN, and a third amplified voltage VTC. The first amplified voltage VTP may linearly increase as the temperature rises, like the first temperature-dependent voltage V1. An increase rate of the first amplified voltage VTP may be greater than that of the first temperature-dependent voltage V1. The second amplified voltage VTN may linearly decrease as the temperature rises, like the second temperature-dependent voltage V2. A decrease rate of the second amplified voltage VTN may be greater than that of the second temperature-dependent voltage V2. The third amplified voltage VTC may have a higher level than the third temperature-dependent voltage V3. The amplifier 112 may generate the first to third amplified voltages VTP, VTN and VTC whose variation rates according to the temperature are greater than the first, second and third temperature-dependent voltages V1, V2 and V3, and the first to third amplified voltages VTP, VTN and VTC are used to control a cycle of a periodic signal OSC. Thus, a cycle variation of the periodic signal OSC according to the temperature may be more accurately measured.

The selector 12 may select one of the first to third amplified voltages VTP, VTN and VTC in response to first to third selection signals SEL<1:3> to output the selected amplified voltage as a control voltage V_CNT. In more detail, the selector 12 may output the first amplified voltage VTP as the control voltage V_CNT when the first selection signal SEL<1> is enabled, and the selector 12 may output the second amplified voltage VTN as the control voltage V_CNT when the second selection signal SEL<2> is enabled. In addition, the selector 12 may output the third amplified voltage VTC as the control voltage V_CNT when the third selection signal SEL<3> is enabled. The first to third selection signals SEL<1:3> may be generated in an integrated circuit (e.g., a semiconductor device) including the period signal generation circuit or in an external test equipment separated from the integrated circuit.

The discharger 21 (for example, including a VSS ground voltage and transistor as illustrated) may discharge charges induced at an internal node ND1 in response to the control voltage V_CNT. A discharge rate of the internal node ND1 may depend on a temperature characteristic of the control voltage V_CNT. That is, when the selector 12 outputs the first amplified voltage VTP as the control voltage V_CNT, the discharge rate of the internal node ND1 may increase as the temperature rises. In such a case, a voltage level of the internal node ND1 may be more rapidly lowered as the temperature rises. Further, when the selector 12 outputs the second amplified voltage VTN as the control voltage V_CNT, the discharge rate of the internal node ND1 may decrease as the temperature rises. In such a case, a voltage level of the internal node ND1 may be lowered at a relatively slow speed as the temperature rises. In contrast, when the selector 12 outputs the third amplified voltage VTC as the control voltage V_CNT, the discharge rate of the internal node ND1 may have a constant value regardless of the temperature. That is, a voltage level of the internal node ND1 may be lowered at a constant rate regardless of the temperature.

The level detector 22 may compare an internal signal INTS induced at the internal node ND1 with a reference voltage VREF to output the periodic signal OSC having a predetermined logic level. That is, the level detector 22 may generate the periodic signal OSC having a logic "high" level when the internal signal INTS has a higher level than the reference voltage VREF, and the level detector 22 may generate the periodic signal OSC having a logic "low" level when the internal signal INTS has a lower level than the reference voltage VREF. A transition point where the periodic signal OSC changes from a logic "high" level to a logic "low" level may be determined by the discharge rate of the internal node ND1 which is under the influence of the discharger 21. That is, if the discharge rate of the internal node ND1 increases, the transition point where the periodic signal OSC changes from a logic "high" level to a logic "low" level may become faster. As a result, if the temperature rises, a cycle time of the periodic signal OSC may be reduced.

The driver 23 may drive the internal node ND1 to a power supply voltage VDD when the periodic signal OSC changes to have a logic "low" level. A point of time that the driver 23 drives the internal node ND1 may be determined by the transition point where the periodic signal OSC changes from a logic "high" level to a logic "low" level. Further, a drivability of the driver 23 for pulling up the internal node ND1 may be determined according to a level of the power supply voltage VDD.

The reset unit 24 may initialize the periodic signal OSC in response to a reset signal RST. In more detail, the reset unit 24 may drive the periodic signal OSC to a ground voltage VSS when the reset signal RST is enabled to have a logic "high" level. The reset signal RST may be set to be enabled when an operation of generating the periodic signal OSC terminates.

Figure 2:
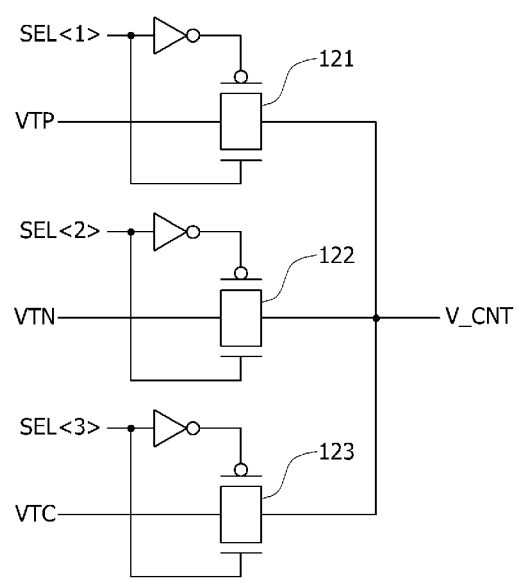
FIG. 2 is a circuit diagram illustrating an example of a selector included in the period signal generation circuit shown in FIG. 1.

FIG. 2 is a circuit diagram illustrating an example of the selector included in the period signal generation circuit shown in FIG. 1.

Referring to FIG. 2, the selector 12 may be configured to include a first transfer gate 121, a second transfer gate 122 and a third transfer gate 123. The first transfer gate 121 may output the first amplified voltage VTP as the control voltage V_CNT when the first selection signal SEL<1> is enabled.

The second transfer gate 122 may output the second amplified voltage VTN as the control voltage V_CNT when the second selection signal SEL<2> is enabled. The third transfer gate 123 may output the third amplified voltage VTC as the control voltage V_CNT when the third selection signal SEL<3> is enabled.

Figure 3:
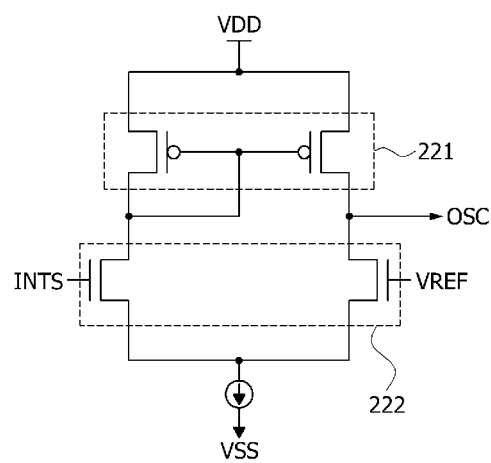
FIG. 3 is a circuit diagram illustrating an example of a level detector included in the period signal generation circuit shown in FIG. 1.

FIG. 3 is a circuit diagram illustrating an example of the level detector included in the period signal generation circuit shown in FIG. 1.

Referring to FIG. 3, the level detector 22 may be configured to include a current source unit 221 and a signal input unit 222. The current source unit 221 may be realized using a current mirror to act as a current source. The signal input unit 222 may receive the internal signal INTS and the reference voltage VREF to determine a logic level of the periodic signal OSC. The level detector 22 may generate the periodic signal OSC having a logic "high" level when the internal signal INTS has a higher level than the reference voltage VREF, and the level detector 22 may generate the periodic signal OSC having a logic "low" level when the internal signal INTS has a lower level than the reference voltage VREF. In FIG. 3, a power supply voltage VDD and a ground Voltage VSS is also illustrated.

An operation of the period signal generation circuit described above will be developed hereinafter with reference to FIG. 4.

First, when the first selection signal SEL<1> is enabled to have a logic "high" level (i.e., "H"), the first amplified voltage VTP may be selected as the control voltage V_CNT. In such a case, since a level of the control voltage V_CNT may increase in a temperature increase section, the discharge rate of the internal node ND1 may increase. Thus, because a level down rate of the internal signal INTS induced at the internal node ND1 may increase, a transition point where the periodic signal OSC changes from a logic "high" level to a logic "low" level may become faster. If the level transition point of the periodic signal OSC becomes faster, a point of time where the periodic signal OSC is driven to a logic "high" level again may also become faster because a point of time where the internal node ND1 is driven becomes faster. As a result, if the temperature rises while the first selection signal SEL<1> is enabled to have a logic "high" level, a cycle time of the periodic signal OSC may be reduced. Meanwhile, since a level of the control voltage V_CNT may decrease in a temperature decrease section, the discharge rate of the internal node ND1 may decrease. Thus, a level down rate of the internal signal INTS induced at the internal node ND1 may decrease, and a transition point where the periodic signal OSC changes from a logic "high" level to a logic "low" level may become slower. If the level transition point of the periodic signal OSC becomes slower, a point of time where the periodic signal OSC is driven to a logic "high" level again may also become slower because a point of time where the internal node ND1 is driven becomes slower. As a result, if the temperature is lowered while the first selection signal SEL<1> is enabled to have a logic "high" level, a cycle time of the periodic signal OSC may be increased.

Next, when the second selection signal SEL<2> is enabled to have a logic "high" level, the second amplified voltage VTN may be selected as the control voltage V_CNT. In such a case, since a level of the control voltage V_CNT may decrease in a temperature increase section, the discharge rate of the internal node ND1 may decrease. Thus, because a level down rate of the internal signal INTS induced at the internal node ND1 may decrease, a transition point where the periodic signal OSC changes from a logic "high" level to a logic "low" level may become slower. If the level transition point of the periodic signal OSC becomes slower, a point of time where the periodic signal OSC is driven to a logic "high" level again may also become slower because a point of time where the internal node ND1 is driven becomes slower. As a result, if the temperature rises while the second selection signal SEL<2> is enabled to have a logic "high" level, a cycle time of the periodic signal OSC may be increased. Meanwhile, since a level of the control voltage V_CNT may increase in a temperature decrease section, the discharge rate of the internal node ND1 may increase. Thus, a level down rate of the internal signal INTS induced at the internal node ND1 may increase, and a transition point where the periodic signal OSC changes from a logic "high" level to a logic "low" level may become faster. If the level transition point of the periodic signal OSC becomes faster, a point of time where the periodic signal OSC is driven to a logic "high" level again may also become faster because a point of time where the internal node ND1 is driven becomes faster. As a result, if the temperature is lowered while the second selection signal SEL<2> is enabled to have a logic "high" level, a cycle time of the periodic signal OSC may be reduced.

Finally, when the third selection signal SEL<3> is enabled to have a logic "high" level, the third amplified voltage VTC may be selected as the control voltage V_CNT. In such a case, since a level of the control voltage V_CNT may have a constant value regardless of a temperature, the discharge rate of the internal node ND1 may also have a constant value. Thus, because a level down rate of the internal signal INTS induced at the internal node ND1 is uniform, a transition point where the periodic signal OSC changes from a logic "high" level to a logic "low" level may also be uniform. As a result, even though the temperature rises up or falls down, a cycle time of the periodic signal OSC may be constant.

As described above, the period signal generation circuit according to the embodiments may vary a cycle time of the periodic signal OSC according to a temperature or may maintain a constant cycle time of the periodic signal OSC regardless of the temperature, in response to the first to third selection signals SEL<1:3>. That is, the cycle time of the periodic signal OSC generated from the period signal generation circuit according to the embodiments may be reduced as the temperature rises up when the first selection signal SEL<1> is enabled, and the cycle time of the periodic signal OSC generated from the period signal generation circuit according to the embodiments may be increased as the temperature rises up when the second selection signal SEL<2> is enabled. Further, the cycle time of the periodic signal OSC generated from the period signal generation circuit according to the embodiments may have a constant value when the third selection signal SEL<3> is enabled. As such, the period signal generation circuit according to the embodiments may generate a periodic signal whose cycle time is appropriately controlled according to a temperature. Therefore, the reliability of an integrated circuit operating in response to the periodic signal may be improved. Further, temperature-dependent voltages that linearly vary may be amplified, and the amplified voltages may be used to control a cycle time of the periodic signal. Thus, a cycle variation of the periodic signal according to the temperature may be more accurately measured and/or monitored.

Figure 5:
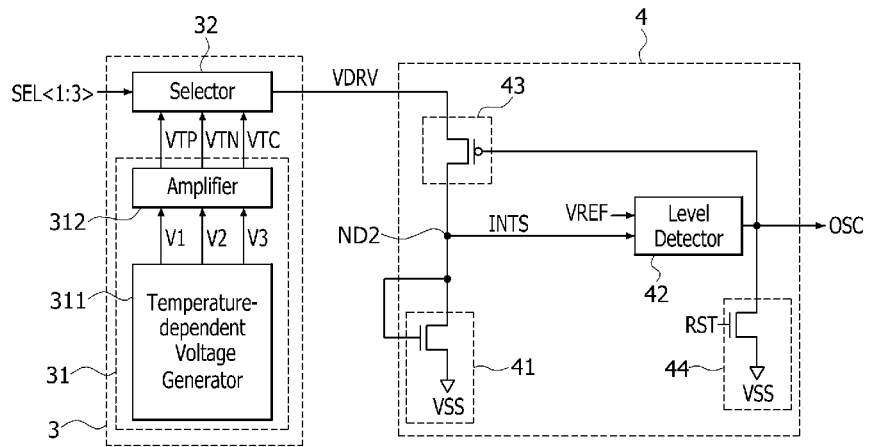
FIG. 5 is a block diagram illustrating a configuration of a period signal generation circuit according to an embodiment.

FIG. 5 is a block diagram illustrating a configuration of a period signal generation circuit according to an embodiment.

As illustrated in FIG. 5, a period signal generation circuit according to the present embodiments may be configured to include a drive voltage generator 3 and a period controller 4. The drive voltage generator 3 may include a temperature-dependent voltage amplifier 31 and a selector 32. The temperature-dependent voltage amplifier 31 may include a temperature-dependent voltage generator 311 and an amplifier 312. The period controller 4 may include a discharger 41, a level detector 42, a driver 43 and a reset unit 44.

The temperature-dependent voltage generator 311 may generate first and second temperature-dependent voltages V1 and V2 whose levels vary according to a temperature, and a third temperature-dependent voltage V3 whose level has a constant value regardless of a temperature. The first temperature-dependent voltage V1 may linearly increase as the temperature rises and the second temperature-dependent voltage V2 may linearly decrease as the temperature rises. The temperature-dependent voltage generator 311 may be realized using a Widlar circuit or the like which generates a constant voltage level or a variable voltage level according to a temperature.

The amplifier 312 may amplify the first, second and third temperature-dependent voltages V1, V2 and V3 to generate a first amplified voltage VTP, a second amplified voltage VTN, and a third amplified voltage VTC. The first amplified voltage VTP may linearly increase as the temperature rises, like the first temperature-dependent voltage V1. An increase rate of the first amplified voltage VTP may be greater than that of the first temperature-dependent voltage V1. The second amplified voltage VTN may linearly decrease as the temperature rises, like the second temperature-dependent voltage V2. A decrease rate of the second amplified voltage VTN may be greater than that of the second temperature-dependent voltage V2. The third amplified voltage VTC may have a higher level than the third temperature-dependent voltage V3. The amplifier 312 may generate the first to third amplified voltages VTP, VTN and VTC whose variation rates according to the temperature are greater than the first, second and third temperature-dependent voltages V1, V2 and V3, and the first to third amplified voltages VTP, VTN and VTC are used to control a cycle of a periodic signal OSC. Thus, a cycle variation of the periodic signal OSC according to the temperature may be more accurately measured.

The selector 32 may select one of the first to third amplified voltages VTP, VTN and VTC in response to first to third selection signals SEL<1:3> to output the selected amplified voltage as a drive voltage VDRV. In more detail, the selector 32 may output the first amplified voltage VTP as the drive voltage VDRV when the first selection signal SEL<1> is enabled, and the selector 32 may output the second amplified voltage VTN as the drive voltage VDRV when the second selection signal SEL<2> is enabled. In addition, the selector 32 may output the third amplified voltage VTC as the drive voltage VDRV when the third selection signal SEL<3> is enabled. The first to third selection signals SEL<1:3> may be generated in an integrated circuit (e.g., a semiconductor device) including the period signal generation circuit or in an external test equipment separated from the integrated circuit. The selector 32 may have substantially the same configuration as the selector 12 described with reference to FIG. 2.

The discharger 41 may discharge charges induced at an internal node ND2. The discharger 41 may be realized using a saturated MOS transistor whose gate and drain are connected to each other and may discharge the charges at the internal node ND2 at a constant rate regardless of a temperature. The source of the discharger 41 may be connected to a ground voltage VSS.

The level detector 42 may compare an internal signal INTS induced at the internal node ND2 with a reference voltage VREF to output the periodic signal OSC having a predetermined logic level. That is, the level detector 42 may generate the periodic signal OSC having a logic "high" level when the internal signal INTS has a higher level than the reference voltage VREF, and the level detector 42 may generate the periodic signal OSC having a logic "low" level when the internal signal INTS has a lower level than the reference voltage VREF. A transition point where the periodic signal OSC changes from a logic "high" level to a logic "low" level may be determined according to a level of the drive voltage VDRV induced at the internal node ND2 driven by the driver 43. That is, if a level of the drive voltage VDRV increases, a time it takes a voltage level of the internal signal INTS to become lower than the reference voltage VREF may be increased. Thus, the transition point where the periodic signal OSC changes from a logic "high" level to a logic "low" level may become slower. As a result, a cycle time of the periodic signal OSC may be increased. In contrast, if a level of the drive voltage VDRV decreases, a time it takes a voltage level of the internal signal INTS to become lower than the reference voltage VREF may be reduced. Thus, the transition point where the periodic signal OSC changes from a logic "high" level to a logic "low" level may become faster. As a result, a cycle time of the periodic signal OSC may be reduced.

The driver 43 may drive the internal node ND2 to the drive voltage VDRV when the periodic signal OSC changes to have a logic "low" level. A point of time where the driver 43 drives the internal node ND2 may be determined by the transition point where the periodic signal OSC changes from a logic "high" level to a logic "low" level. Further, because the driver 43 drives the internal node ND2 to the drive voltage VDRV, a level of the internal node ND2 may be increased with increase of a level of the drive voltage VDRV.

The reset unit 44 may initialize the periodic signal OSC in response to a reset signal RST. In more detail, the reset unit 44 may drive the periodic signal OSC to a ground voltage VSS when the reset signal RST is enabled to have a logic "high" level. The reset signal RST may be set to be enabled when an operation of generating the periodic signal OSC terminates.

An operation of the period signal generation circuit described above will be developed hereinafter with reference to FIG. 6.

First, when the first selection signal SEL<1> is enabled to have a logic "high" level (i.e., "H"), the first amplified voltage VTP may be selected as the drive voltage VDRV. In such a case, since a level of the drive voltage VDRV may increase in a temperature increase section, a level of the internal node ND2 driven by the driver 43 may increase. Thus, because the time it takes a voltage level of the internal signal INTS induced at the internal node ND2 to become lower than the reference voltage VREF is increased, the transition point where the periodic signal OSC changes from a logic "high" level to a logic "low" level may become slower. As a result, if the temperature rises while the first selection signal SEL<1> is enabled to have a logic "high" level, a cycle time of the periodic signal OSC may be increased. Meanwhile, since a level of the drive voltage VDRV may decrease in a temperature decrease section, a level of the internal node ND2 driven by the driver 43 may decrease. Thus, because the time it takes a voltage level of the internal signal INTS induced at the internal node ND2 to become lower than the reference voltage VREF is reduced, the transition point where the periodic signal OSC changes from a logic "high" level to a logic "low" level may become faster. As a result, if the temperature is lowered while the first selection signal SEL<1> is enabled to have a logic "high" level, a cycle time of the periodic signal OSC may be reduced.

Next, when the second selection signal SEL<2> is enabled to have a logic "high" level, the second amplified voltage VTN may be selected as the drive voltage VDRV. In such a case, since a level of the drive voltage VDRV may decrease in a temperature increase section, a level of the internal node ND2 driven by the driver 43 may decrease. Thus, because the time it takes a voltage level of the internal signal INTS induced at the internal node ND2 to become lower than the reference voltage VREF is reduced, the transition point where the periodic signal OSC changes from a logic "high" level to a logic "low" level may become faster. As a result, if the temperature rises while the second selection signal SEL<2> is enabled to have a logic "high" level, a cycle time of the periodic signal OSC may be reduced. Meanwhile, since a level of the drive voltage VDRV may increase in a temperature decrease section, a level of the internal node ND2 driven by the driver 43 may increase. Thus, because the time it takes a voltage level of the internal signal INTS induced at the internal node ND2 to become lower than the reference voltage VREF is increased, the transition point where the periodic signal OSC changes from a logic "high" level to a logic "low" level may become slower. As a result, if the temperature is lowered while the first selection signal SEL<1> is enabled to have a logic "high" level, a cycle time of the periodic signal OSC may be increased.

Finally, when the third selection signal SEL<3> is enabled to have a logic "high" level, the third amplified voltage VTC may be selected as the drive voltage VDRV. In such a case, since a level of the drive voltage VDRV may have a constant value regardless of a temperature, a level of the internal node ND2 driven by the driver 43 may also have a constant value. Thus, because a level of the internal node ND2 is uniform, a transition point where the periodic signal OSC changes from a logic "high" level to a logic "low" level may be occur regularly. As a result, even though the temperature rises up or falls down while the third selection signal SEL<3> is enabled to have a logic "high" level, a cycle time of the periodic signal OSC may be constant.

As described above, the period signal generation circuit according to the embodiments may vary a cycle time of the periodic signal OSC according to a temperature or may maintain a constant cycle time of the periodic signal OSC regardless of the temperature, in response to the first to third selection signals SEL<1:3>. That is, the cycle time of the periodic signal OSC generated from the period signal generation circuit according to the embodiments may be increased as the temperature rises up when the first selection signal SEL<1> is enabled, and the cycle time of the periodic signal OSC generated from the period signal generation circuit according to the embodiments may be reduced as the temperature rises up when the second selection signal SEL<2> is enabled. Further, the cycle time of the periodic signal OSC generated from the period signal generation circuit according to the embodiments may have a constant value when the third selection signal SEL<3> is enabled. As such, the period signal generation circuit according to the embodiments may generate a periodic signal whose cycle time is appropriately controlled according to a temperature. Therefore, the reliability of an integrated circuit operating in response to the periodic signal may be improved. Further, temperature-dependent voltages that linearly vary may be amplified, and the amplified voltages may be used to control a cycle time of the periodic signal. Thus, a cycle variation of the periodic signal according to the temperature may be more accurately measured and/or monitored.

Figure 7:
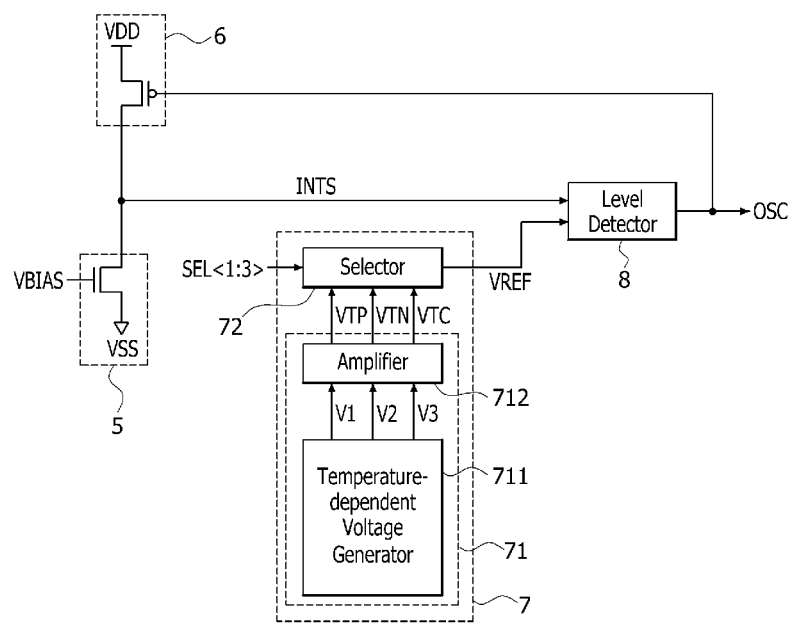
FIG. 7 is a block diagram illustrating a configuration of a period signal generation circuit according to an embodiment.

FIG. 7 is a block diagram illustrating a configuration of a period signal generation circuit according to an embodiment.

As illustrated in FIG. 7, a period signal generation circuit according to the present embodiments may be configured to include a discharger 5, a driver 6, a reference voltage generator 7 and a level detector 8. The reference voltage generator 7 may be configured to include a temperature-dependent voltage amplifier 71 and a selector 72. The temperature-dependent voltage amplifier 71 may include a temperature-dependent voltage generator 711 and an amplifier 712.

The discharger 5 may receive a bias voltage VBIAS to discharge charges of an internal node at which an internal signal INTS is induced. The bias voltage VBIAS may be set to have a constant level such that the discharger 5 uniformly discharges the charge of the internal node outputting the internal signal INTS at a constant rate regardless of a temperature. In FIG. 7 a ground voltage VSS is also illustrated.

The driver 6 may drive the internal signal INTS to a power supply voltage VDD when a periodic signal OSC changes to have a logic "low" level. A point of time when the driver 6 drives the internal signal INTS may be determined by a transition point where the periodic signal OSC changes from a logic "high" level to a logic "low" level.

The temperature-dependent voltage generator 711 may generate first and second temperature-dependent voltages V1 and V2 whose levels vary according to a temperature, and a third temperature-dependent voltage V3 whose level has a constant value regardless of a temperature. The first temperature-dependent voltage V1 may linearly increase as the temperature rises and the second temperature-dependent voltage V2 may linearly decrease as the temperature rises. The temperature-dependent voltage generator 711 may be realized using a Widlar circuit or the like which generates a constant voltage level or a variable voltage level according to a temperature.

The amplifier 712 may amplify the first, second and third temperature-dependent voltages V1, V2 and V3 to generate a first amplified voltage VTP, a second amplified voltage VTN, and a third amplified voltage VTC. The first amplified voltage VTP may linearly increase as the temperature rises, like the first temperature-dependent voltage V1. An increase rate of the first amplified voltage VTP may be greater than that of the first temperature-dependent voltage V1. The second amplified voltage VTN may linearly decrease as the temperature rises, like the second temperature-dependent voltage V2. A decrease rate of the second amplified voltage VTN may be greater than that of the second temperature-dependent voltage V2. The third amplified voltage VTC may have a higher level than the third temperature-dependent voltage V3. The amplifier 712 may generate the first to third amplified voltages VTP, VTN and VTC whose variation rates according to the temperature are greater than the first, second and third temperature-dependent voltages V1, V2 and V3, and the first to third amplified voltages VTP, VTN and VTC are used to control a cycle of a periodic signal OSC. Thus, a cycle variation of the periodic signal OSC according to the temperature may be more accurately measured.

The selector 72 may select one of the first to third amplified voltages VTP, VTN and VTC in response to first to third selection signals SEL<1:3> to output the selected amplified voltage as a reference voltage VREF. In more detail, the selector 72 may output the first amplified voltage VTP as the reference voltage VREF when the first selection signal SEL<1> is enabled, and the selector 72 may output the second amplified voltage VTN as the reference voltage VREF when the second selection signal SEL<2> is enabled. In addition, the selector 72 may output the third amplified voltage VTC as the reference voltage VREF when the third selection signal SEL<3> is enabled. The first to third selection signals SEL<1:3> may be generated in an integrated circuit (e.g., a semiconductor device) including the period signal generation circuit or in an external test equipment separated from the integrated circuit. The selector 72 may have substantially the same configuration as the selector 12 described with reference to FIG. 2.

The level detector 8 may compare the internal signal INTS with the reference voltage VREF to output the periodic signal OSC having a predetermined logic level. That is, the level detector 8 may generate the periodic signal OSC having a logic "high" level when the internal signal INTS has a higher level than the reference voltage VREF, and the level detector 8 may generate the periodic signal OSC having a logic "low" level when the internal signal INTS has a lower level than the reference voltage VREF. A transition point where the periodic signal OSC changes from a logic "high" level to a logic "low" level may be determined by a level of the reference voltage VREF. That is, if a level of the reference voltage VREF increases, a time it takes a voltage level of the internal signal INTS to become lower than the reference voltage VREF may be reduced. Thus, the transition point where the periodic signal OSC changes from a logic "high" level to a logic "low" level may become faster. As a result, a cycle time of the periodic signal OSC may be reduced. In contrast, if a level of the reference voltage VREF decreases, a time it takes a voltage level of the internal signal INTS to become lower than the reference voltage VREF may be increased. Thus, the transition point where the periodic signal OSC changes from a logic "high" level to a logic "low" level may become slower. As a result, a cycle time of the periodic signal OSC may be increased.

An operation of the period signal generation circuit described above will be developed hereinafter with reference to FIG. 8.

First, when the first selection signal SEL<1> is enabled to have a logic "high" level (i.e., "H"), the first amplified voltage VTP may be selected as the reference voltage VREF. In such a case, since a level of the reference voltage VREF may increase in a temperature increase section, a time it takes a voltage level of the internal signal INTS to become lower than the reference voltage VREF is reduced. Thus, the transition point where the periodic signal OSC changes from a logic "high" level to a logic "low" level may become faster. As a result, if the temperature rises while the first selection signal SEL<1> is enabled to have a logic "high" level, a cycle time of the periodic signal OSC may be reduced. Meanwhile, since a level of the reference voltage VREF may decrease in a temperature decrease section, a time it takes a voltage level of the internal signal INTS to become lower than the reference voltage VREF is increased. As a result, as the transition point where the periodic signal OSC changes from a logic "high" level to a logic "low" level may become slower, a cycle time of the periodic signal OSC may be increased.

Next, when the second selection signal SEL<2> is enabled to have a logic "high" level, the second amplified voltage VTN may be selected as the reference voltage VREF. In such a case, since a level of the reference voltage VREF may decrease in a temperature increase section, the time it takes a voltage level of the internal signal INTS to become lower than the reference voltage VREF may be increased. Thus, the transition point where the periodic signal OSC changes from a logic "high" level to a logic "low" level may become slower. As a result, a cycle time of the periodic signal OSC may be increased. Meanwhile, since a level of the reference voltage VREF may increase in a temperature decrease section, the time it takes a voltage level of the internal signal INTS to become lower than the reference voltage VREF may be reduced. Thus, the transition point where the periodic signal OSC changes from a logic "high" level to a logic "low" level may become faster. As a result, a cycle time of the periodic signal OSC may be reduced.

Finally, when the third selection signal SEL<3> is enabled to have a logic "high" level, the third amplified voltage VTC may be selected as the reference voltage VREF. In such a case, since a level of the reference voltage VREF may have a constant value regardless of a temperature, the time it takes a voltage level of the internal signal INTS to become lower than the reference voltage VREF may always be constant. Thus, a transition point where the periodic signal OSC changes from a logic "high" level to a logic "low" level may regularly occur. As a result, even though the temperature rises up or falls down while the third selection signal SEL<3> is enabled to have a logic "high" level, a cycle time of the periodic signal OSC may be constant.

As described above, the period signal generation circuit according to the embodiments may vary a cycle time of the periodic signal OSC according to a temperature or may maintain a constant cycle time of the periodic signal OSC regardless of the temperature, in response to the first to third selection signals SEL<1:3>. That is, the cycle time of the periodic signal OSC generated from the period signal generation circuit according to the embodiments may be reduced as the temperature rises up when the first selection signal SEL<1> is enabled, and the cycle time of the periodic signal OSC generated from the period signal generation circuit according to the embodiments may be increased as the temperature rises up when the second selection signal SEL<2> is enabled. Further, the cycle time of the periodic signal OSC generated from the period signal generation circuit according to the embodiments may have a constant value when the third selection signal SEL<3> is enabled. As such, the period signal generation circuit according to the embodiments may generate a periodic signal whose cycle time is appropriately controlled according to a temperature. Therefore, the reliability of an integrated circuit operating in response to the periodic signal may be improved. Further, temperature-dependent voltages that linearly vary may be amplified, and the amplified voltages may be used to control a cycle time of the periodic signal. Thus, a cycle variation of the periodic signal according to the temperature may be more accurately measured and/or monitored.

According to the embodiments set forth above, a periodic signal whose cycle time is controlled according to a temperature may be generated to improve the reliability of an integrated circuit.

Further, a periodic signal whose cycle time is constant regardless of a temperature may be selectively generated.

In addition, temperature-dependent voltages that linearly vary may be amplified, and the amplified voltages may be used to control a cycle time of the periodic signal. Thus, a cycle variation of the periodic signal according to the temperature may be more accurately measured and/or monitored to improve the reliability of the integrated circuit.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:
1. A period signal generation circuit, the circuit comprising:
a discharger configured to discharge charges of an internal node in response to a bias voltage;

a reference voltage generator configured to select one of plurality of temperature-dependent voltages to output the selected temperature-dependent voltage as a reference voltage;

a level detector configured to compare an internal signal induced at the internal node with the reference voltage to determine a logic level of a periodic signal; and a driver configured to drive the internal node in response to the periodic signal, wherein the plurality of temperature-dependent voltages comprise first to third temperature-dependent voltages, levels of the first and second temperature-dependent voltages vary according to a temperature and a level of the third temperature-dependent voltage is constant regardless of the temperature.

2. The circuit of claim 1, wherein the bias voltage is set to have a constant level regardless of variation of the temperature.

3. The circuit of claim 1, wherein a level of the first temperature-dependent voltage increases as the temperature rises and a level of the second temperature-dependent voltage decreases as the temperature rises.

4. The circuit of claim 3, wherein the levels of the first and second temperature-dependent voltages linearly vary according to variation of the temperature.

5. The circuit of claim 3, wherein the reference voltage generator includes:

a temperature-dependent voltage generator configured to generate the first to third temperature-dependent voltages;

an amplifier configured to amplify the first and second temperature-dependent voltages varying according to the temperature to generate a first amplified voltage and a second amplified voltage and configured to amplify the third temperature-dependent voltage to generate a third amplified voltage; and a selector configured to select one the first to third amplified voltages in response to selection signals to output the selected amplified voltage as the reference voltage.

6. The circuit of claim 5, wherein the selection signals are generated from an internal circuit or an external circuit.

7. The circuit of claim 5, wherein the selection signals include a first selection signal, a second selection signal and a third selection signal, the selector includes:

a first transfer gate configured to output the first amplified voltage as the reference voltage in response to the first selection signal;

a second transfer gate configured to output the second amplified voltage as the reference voltage in response to the second selection signal; and a third transfer gate configured to output the third amplified voltage as the reference voltage in response to the third selection signal.

8. The circuit of claim 1, wherein the level detector is configured to generate the periodic signal having a first logic level when the internal signal has a higher level than the reference voltage and to generate the periodic signal having a second logic level when the internal signal has a lower level than the reference voltage.

9. The circuit of claim 8, wherein the driver is configured to drive the internal node when the periodic signal has the second logic level.

* * * * *